METHOD OF MAKING SYMMETRICAL SWITCHING DIODE

Original Filed March 8, 1963

Donald F. Cook
David F. Cosper
INVENTOR

BY [signature]

ATTORNEY 3,299,487

METHOD OF MAKING SYMMETRICAL SWITCHING DIODE

Donald F. Cook, Plano, and David F. Cosper, Dallas, Tex., assignors to Texas Instruments Incorporated, Dallas Tex., a corporation of Delaware Original application Mar. 8, 1963, Ser. No. 263,943, now Patent No. 3,196,329. Divided and this application May 27, 1965, Ser. No. 477,055
1 Claim. (Cl. 29—25.3)

This is a division of application Serial No. 263,943, filed March 8, 1963, and now Patent Number 3,196,329.

This invention relates to semiconductor devices, and more particularly to a threshold trigger diode having symmetrical characteristics.

Four-layer diodes have recently attained wide acceptance as triggering devices for applications such as firing silicon controlled rectifiers. These devices are very sensitive to temperature changes, however, and exhibit a marked reduction in breakover voltage at elevated temperatures due to the high temperature dependence of the relatively high gain transistors making up the four-layer diode. Also, PNPN diodes are somewhat complicated in fabrication, requiring several steps, and the resulting devices are not symmetrical, making them unsuited for a simple full-wave triggering circuit.

Various three-layer semiconductor devices have been proposed as trigger devices but none have provided the symmetrical characteristics necessary for use in triggering two controlled rectifiers with only one triggering device. Also, previous devices of this type have not exhibited suitable temperature independence of breakover voltage.

It is the principal object of this invention to provide a symmetrical threshold trigger diode having breakover points which are not substantially affected by temperature. Another object is to provide a three-layer diode adapted for triggering or switching uses. An additional object is to provide an improved three-layer avalanche diode.

In accordance with this invention, a three-layer geometry is provided in a semiconductor device by simultaneously converting the conductivity-type of layers on each side of a semiconductor wafer. Preferably, this is done by a single diffusion step. This three-layer diode has a breakover voltage which is the same in both directions and which varies relatively little with temperature due to the wide base and low gain of the transistor-like device resulting from the three layers. The breakover voltage can be easily controlled by the concentrations of the outer layers and/or the resistivity of the central region. The break-back voltage may be controlled by the width of the central region or by its impurity concentration. Due to symmetry, the same factors which affect the breakdown voltage and break-back voltage in one direction will likewise affect these characteristics in the other direction.

The novel features which are believed to be characteristic of this invention are set forth in the appended claims. The invention may best be understood, however, by reference to the following detailed description of an illustrative embodiment, read in conjunction with the accompanying drawing, wherein:

Figure 1:
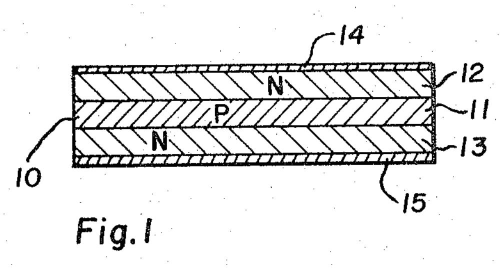
FIG. 1 is an elevational view in section of a three-layer diode according to this invention.

With reference to FIG. 1, there is shown a semiconductor diode having symmetrical charactertistics according to this invention. This device comprises a wafer 10 of single crystal silicon having a central region 11 of P-type conductivity between outer regions 12 and 13 of N-type conductivity. This device may be fabricated using a single diffusion operation starting with a slice of monocrystalline silicon doped in growing with boron to provide a uniform resistivity of about 0.2 ohm-cm. The slice would ordinarily be perhaps an inch in diameter so that a large number of devices could be produced from a single slice at the same time, and would have thickness of about 3 mils. After cleaning and polishing the surfaces, the slice is subjected to a vapor deposition of phosphorous. This is a conventional technique, and may comprise heating a phosphorous source, such as $P_2O_5$, to a temperature of about 300° C. adjacent the slices in a tube furnace. The slices are heated to about 1050° C., and carrier gas is passed over the heated phosphorous to deposit the impurity on the heated silicon. This deposition may continue for about 30 minutes. The silicon slices are then placed in a diffusion furnace, or else the heat is turned off for the phosphorous source, for about eight to ten hours at a temperature of about 1250° C., for example, producing a P-N junction depth of perhaps one mil on each side. The diffusion time, the slice thickness and/or the resistivity of the slices may be adjusted to give the desired thickness and concentration of the central region 11. Preferably, this width should be about 0.6 to 1.0 mil. The surface concentrations of n-type impurity in the regions 12 and 13 is quite high, in the range of $10^{20}$ to $10^{21}$ per $cm.^3$.

Figure 2:
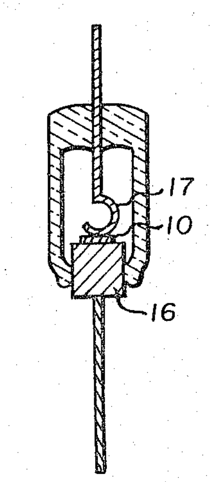
FIG. 2 is a sectional view of a packaging arrangement for the diode of this invention.

The devices of FIG. 1 may be packaged in any suitable manner after first scribing the large slices and breaking into small wafers 10 of perhaps 40 mils width. Prior to this, however, ohmic contacts 14 and 15 may be provided by plating with nickel, sintering, and then plating with gold. After cutting up the large slices, each of the small wafers 10 is bonded on one side to a molybdenum slug 16 as seen in FIG. 2, and the other contact is engaged by a C-shaped resilient contact 17. Lead wires bonded to the moly slug and the contact 17 extend from opposite ends of the package, and a glass tube fused at opposite ends to the slug and one of the lead wires completes the package.

Figure 3:
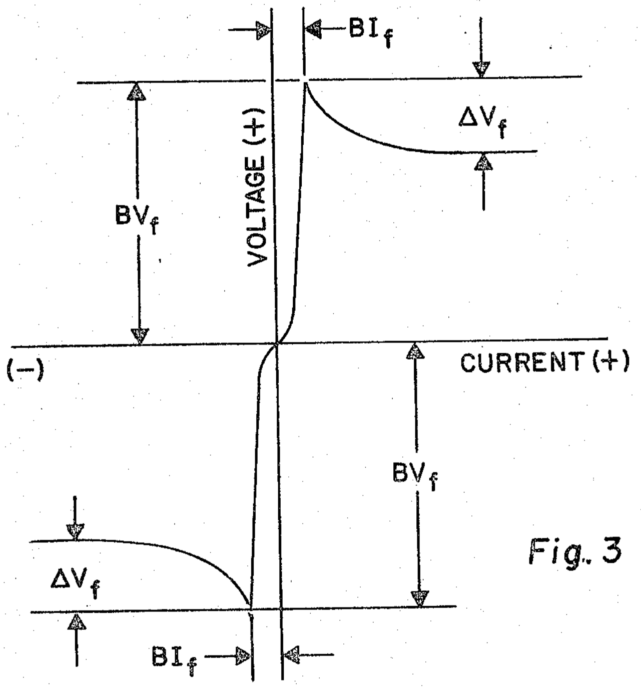
FIG. 3 is a graphic representation of the current voltage characteristics of the device of FIG. 1.

The voltage-current characteristics of the device of FIG. 1 will resemble the graph of FIG. 3. It is seen that the device is symmetrical about the zero voltage, zero current point. Typical values for the breakdown voltage $BV_f$, in both directions, would be 35 volts. The breakdown current in either direction, $BI_f$, would be perhaps $50\mu$ amp. The change in voltage drop after breakdown, $\Delta V_f$, would be about five volts. The voltage after breakdown is referred to as the backbreak voltage.

The device of FIG. 1 is seen to resemble an N-P-N transistor with no connection to the base. However, this three-layer diode differs from a structure which would be used as a transistor in several significant aspects. First, the concentration of P-type impurities in the "base" region 11 is in excess of levels ordinarily used for transistors. In the illustrative example, a resistivity of 0.2 ohm-cm. is specified, corresponding to greater than $10^{17}$ carriers/$cm.^3$ in P-type silicon at room temperature. This high concentration of impurities in the central region contributes to several functions in the characteristics of the device. The temperature dependence of carriers in the central region is much less at this impurity level, and the minority carrier lifetime is relatively small resulting in a low transport efficiency and current gain if the device is considered as a transistor. Secondly, the width of the central region 11 is much greater than the base width of a silicon transistor. The example set forth above gives a width of 0.6 to 1.0 mil for the region 11, this being perhaps an order of magnitude greater than the thickness of the base in a contemporary silicon transistor. The width of the region 11, along with its high concentration, serves to minimize the $\alpha$ of the corresponding transistor, reducing temperature dependence, and also insures that the device will operate by the avalanche breakdown mechanism rather than by "punch through" or extension of the depletion region from one junction to the other. Third, silicon transistors are usually formed by a double-diffusion technique, with the emitter being of perhaps two orders of magnitude greater concentration than the base, which in turn is of about two orders of magnitude greater concentration than the collector. This arrangement is desirable in a silicon transistor, due to the very thin base regions necessary, so that the reverse bias on the collector-base junction will not produce punch-through at a small value. In the device of this invention, the thick central region with high impurity concentration eliminates the possibility of punch-through occuring before avalanche breakdown.

In the production of the devices of FIG. 1, various factors which change from one silicon slice to the next or between runs tend to cause a variation in the thickness of the central region 11. Some devices may have a base thickness of 0.06 mil, and the others a thickness of 0.8 mil, due to factors that are difficult to predict or control. However, this variation in base thickness will have little or no effect on the breakdown voltage $BV_f$, so long as the original impurity concentration in the slice is the same and the doping level of the outer layers remains constant. This inadvertent variation in the base thickness will alter the characteristics of the device after breakdown, however, since a thinner base will result in a gereater $\alpha$. Accordingly, $\Delta V_f$ will be an inverse function of base thickness.

Figure 4:
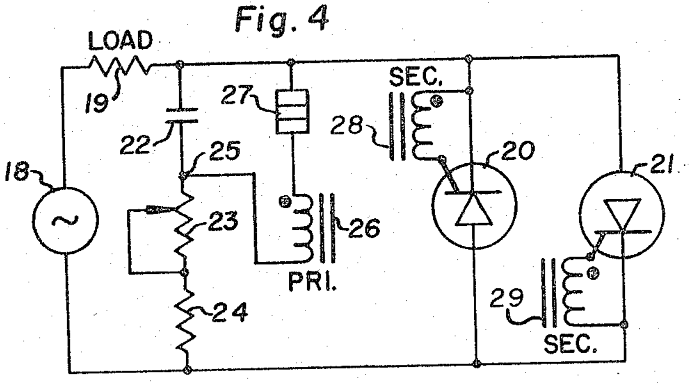
FIG. 4 is a schematic diagram of a circuit using a three-layer diode of FIG. 1.

A circuit for switching two controlled rectifiers using only one trigger device which has the above characteristics is seen in FIG. 4. This is a convenient circuit for use as a light dimmer. An alternating current source 18 is connected in series with a load 19 and a pair of back-to-back controlled rectifiers 20 and 21. The load 19 may be one or more lamps. A capacitor 22 and variable and fixed resistors 23 and 24 are connected in series across the anode-cathode paths of the rectifiers. A junction 25 between the RC elements is connected to one side of the load through a primary winding 26 of a transformer and a three layer symmetrical diode 27. The transformer has a pair of secondary windings 28 and 29, one being connected across the gate and cathode of each of the controlled rectifiers 20 and 21.

In operation, the circuit of FIG. 4 will supply current to the load 19 during each half cycle to the extend that the controlled rectifiers 20 and 21 are conductive during the respective half cycles when the anodes of the respective controlled rectifiers are positive. The conducting angles will be determined by the point at which firing pulses will be applied to the gates. These firing pulses are supplied through the transformer by breakdown of the three layer diode 27. For example, assume that neither controlled rectifier is conducting and the output of the A.C. source 18 is beginning its positive half cycle, dividing the upper supply line positive with respect to the lower. Under such conditions, the capacitor 22 will charge at a rate determined by the setting of the potentiometer 23, the upper terminal of the capacitor being positive. When the breakdown voltage of the diode 27 is reached, the capacitor will discharge through the primary winding 26, producing a positive triggering pulse on the gate of the controlled rectifier 21 by means of the secondary winding 29. This rectifier 21 will then conduct for the remainder of the half cycle. On the negative half cycle, the capacitor 22 charges in a similar manner except in this case the lower terminal is positive. When the breakdown voltage of the diode is reached, the capacitor will discharge in an upward direction through the primary winding 26 to provide a firing pulse to the gate of the controlled rectifier 20. Since the characteristics of the diode 27 are symmetrical, the two controlled rectifiers will have the same firing angles.

While this invention has been described with reference to a particular embodiment, this description is not meant to be construed in a limiting sense. Various modifications of the illustrated embodiment, as well as other embodiments of the invention, will be apparent to persons skilled in the art upon reading this description. Accordingly, it is contemplated that the appended claim will be interpreted to cover any such modifications or embodiments as fall within the true scope of the invention.

What is claimed is:

A method of manufacturing a symmetrical three-layer avalanche diode comprising:

(a) providing a thin wafer of monocrystalline silicon uniformly doped in growing to a concentration of over $10^{17}$ per cm.$^3$ of conductivity determining impurity material of one type; the wafer having a thickness of about 3 mils; the wafer being subjected to cleaning and polishing of the surface thereof;

(b) simultaneously diffusing into both major faces of the wafer a conductivity-determining material of the opposite-conductivity type until the outer layers produced by the diffusion reach surface impurity concentrations in the range of about $10^{20}$ to $10^{21}$ per cm.$^3$ and more than two orders of magnitude greater than in the region separating said layers, the outer layers being within about .6 to 1.0 mil of each other, said outer layers being separated by a central region of said one conductivity type, and (c) respectively applying metallic contacts to both of said major faces of the wafer to provide non-rectifying contacts to said outer layers.

References Cited by the Examiner

UNITED STATES PATENTS

| | | | |
|---|---|---|---|
| 2,790,940 | 4/1957 | Prince | 148—186 X |
| 2,900,286 | 8/1959 | Goldstein | 148—1.5 |

JOHN F. CAMPBELL, *Primary Examiner.*

WILLIAM I. BROOKS, *Examiner.*